(12) United States Patent
Nam et al.

(10) Patent No.: US 9,552,886 B2
(45) Date of Patent: Jan. 24, 2017

(54) MEMORY SYSTEM AND METHOD OF DRIVING MEMORY SYSTEM USING ZONE VOLTAGES

(71) Applicants: Sang-Wan Nam, Hwaseong-si (KR); Minsu Kim, Hwaseong-si (KR); Kang-Bin Lee, Seongnam-si (KR); Kitae Park, Seongnam-si (KR)

(72) Inventors: Sang-Wan Nam, Hwaseong-si (KR); Minsu Kim, Hwaseong-si (KR); Kang-Bin Lee, Seongnam-si (KR); Kitae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/855,433

(22) Filed: Sep. 16, 2015

(65) Prior Publication Data

US 2016/0005478 A1    Jan. 7, 2016

Related U.S. Application Data

(62) Division of application No. 14/056,268, filed on Oct. 17, 2013, now Pat. No. 9,165,669.

(30) Foreign Application Priority Data

Feb. 13, 2013    (KR) .......................... 10-2013-0015295

(51) Int. Cl.

| | |
|---|---|
| *G11C 16/10* | (2006.01) |
| *G11C 16/26* | (2006.01) |
| *G11C 16/30* | (2006.01) |
| *G11C 5/14* | (2006.01) |
| *G11C 16/24* | (2006.01) |
| *G11C 16/08* | (2006.01) |
| *G11C 16/04* | (2006.01) |
| *G11C 16/16* | (2006.01) |
| *G11C 16/34* | (2006.01) |
| *G11C 16/14* | (2006.01) |

(52) U.S. Cl.
CPC ........... *G11C 16/24* (2013.01); *G11C 16/0483* (2013.01); *G11C 16/08* (2013.01); *G11C 16/14* (2013.01); *G11C 16/16* (2013.01); *G11C 16/26* (2013.01); *G11C 16/3418* (2013.01); *G11C 5/147* (2013.01); *G11C 16/10* (2013.01); *G11C 16/3459* (2013.01)

(58) Field of Classification Search
CPC . G11C 16/10; G11C 16/0483; G11C 16/3459; G11C 16/08; G11C 5/147
USPC ............ 365/189.09, 185.05, 185.11, 185.17, 365/185.18
See application file for complete search history.

(56) References Cited

U.S. PATENT DOCUMENTS

| | | | |
|---|---|---|---|
| 7,668,014 B2 | 2/2010 | Hwang | |
| 7,706,188 B2 | 4/2010 | Kim | |
| 7,983,084 B2 | 7/2011 | Tokiwa et al. | |
| 8,426,294 B2 | 4/2013 | Lung et al. | |

(Continued)

*Primary Examiner* — Ly D Pham
(74) *Attorney, Agent, or Firm* — Volentine & Whitt, PLLC

(57) ABSTRACT

A method is provided for driving a nonvolatile memory device, including multiple strings, where each string is formed by penetrating plate-shaped word lines stacked on a substrate. The method includes configuring the word lines of a string in multiple zones based on zone configuration information, and applying zone voltages to the zones, respectively. The zone configuration information is varied according to a mode of operation.

20 Claims, 9 Drawing Sheets

(56) References Cited

U.S. PATENT DOCUMENTS

| | | |
|---|---|---|
| 8,427,878 B2 | 4/2013 | Shim et al. |
| 8,456,918 B2 | 6/2013 | Oh et al. |
| 2009/0238003 A1 | 9/2009 | Namiki et al. |
| 2010/0067305 A1 | 3/2010 | Park et al. |
| 2011/0199825 A1 | 8/2011 | Han et al. |
| 2011/0199833 A1 | 8/2011 | Shim et al. |
| 2011/0286274 A1 | 11/2011 | Chang et al. |
| 2012/0033501 A1 | 2/2012 | Park et al. |
| 2012/0051138 A1 | 3/2012 | Kim et al. |
| 2012/0069660 A1 | 3/2012 | Iwai et al. |
| 2012/0069664 A1 | 3/2012 | Kim et al. |
| 2012/0134210 A1 | 5/2012 | Maeda |
| 2012/0140562 A1 | 6/2012 | Choe et al. |
| 2012/0170371 A1 | 7/2012 | Aritome et al. |
| 2012/0224426 A1 | 9/2012 | Nam et al. |
| 2012/0257455 A1 | 10/2012 | Oh et al. |
| 2013/0010548 A1 | 1/2013 | Aritome |
| 2013/0107629 A1 | 5/2013 | Shim et al. |
| 2013/0250691 A1 | 9/2013 | Kim et al. |
| 2013/0301366 A1* | 11/2013 | Huh ................ G11C 7/02 365/189.011 |
| 2014/0063985 A1* | 3/2014 | Joo ................ G11C 16/0483 365/189.011 |
| 2014/0108705 A1* | 4/2014 | Gorobets ........ G11C 16/3431 711/103 |

\* cited by examiner

MEMORY SYSTEM AND METHOD OF DRIVING MEMORY SYSTEM USING ZONE VOLTAGES

CROSS-REFERENCE TO RELATED APPLICATIONS

This application is a Divisional of U.S. application Ser. No. 14/056,268, filed Oct. 17, 2013, in which a claim for priority under 35 U.S.C. §119 is made to Korean Patent Application No. 10-2013-0015295 filed Feb. 13, 2013, in the Korean Intellectual Property Office, the entire contents of which are hereby incorporated by reference.

BACKGROUND

Embodiments of the inventive concepts described herein relate to a memory system and a driving method thereof.

Semiconductor memory devices may be volatile or nonvolatile memory devices. A nonvolatile semiconductor memory device may retain data stored therein even when powered off. The nonvolatile memory device may be permanent or reprogrammable, depending upon the fabrication technology used. The nonvolatile memory device may be used for user data, program, and microcode storage in a wide variety of applications in the computer, avionics, telecommunications, and consumer electronics industries, for example.

SUMMARY

One aspect of embodiments of the inventive concept provides a method for driving a nonvolatile memory device, including multiple strings, where each string is formed by penetrating plate-shaped word lines stacked on a substrate. The method includes configuring the word lines of a string in multiple zones based on zone configuration information, and applying zone voltages to the zones, respectively. The zone configuration information is varied according to a mode of operation.

The zone configuration information may be generated in the nonvolatile memory device. Alternatively, the zone configuration information may be provided from an external device.

The method may further include determining whether the zone configuration is required.

The mode of operation may include one of a program mode, a read mode or an erase mode. The zone configuration information during the program mode may be the same as the zone configuration information during the read mode, and the zone configuration information during the read and program modes may be different from the zone configuration information during the erase mode.

The method may further include applying a selection voltage to a selected word line during a read operation or a program operation. Unselected word lines may be configured into the zones, and applying zone voltages to the zones may include applying the zone voltages to the configured zones of the unselected word lines.

The method may further include generating the selection voltage, and generating the zone voltages.

The method may further include applying an erase voltage to the substrate during an erase operation, while applying the zone voltages to the configured zones. The method may further include changing the zone configuration information when erase speeds of memory cells corresponding to the zones are different.

Configuring the word lines to the zones based on zone configuration information may include selecting one of the word lines to which one of the zone voltages is to be applied, based on the zone configuration information.

Another aspect of embodiments of the inventive concept provides a memory system including a nonvolatile memory device and a memory controller. The nonvolatile memory device has multiple memory blocks, each memory block having multiple strings formed by penetrating plate-shaped word lines stacked on a substrate. The memory controller is configured to control the nonvolatile memory device. The nonvolatile memory device further includes a zone controller configured to control configuration of the word lines to a plurality of zones based on zone configuration information, and multiple zone voltage generators configured to generate zone voltages corresponding to the zones. The zone configuration information is varied according to a mode of operation of the nonvolatile memory device.

The nonvolatile memory device may further include an address decoder configured to select one of the memory blocks based on an input address and to provide the zone voltages to corresponding zones based on the zone configuration information for the selected memory block.

The nonvolatile memory device may further include a selection voltage generator configured to generate a selection voltage to be applied to a selected one of the word lines during a program operation or a read operation.

The memory controller may be configured to determine whether a change of the zone configuration information is required, and to send new zone configuration information to the nonvolatile memory device based on the determination result.

Another aspect of embodiments of the inventive concept provides a nonvolatile memory device, including a memory cell array, a voltage generating circuit and an address decoder. The memory cell array includes a memory block having multiple strings and multiple word lines, where the strings include corresponding pillars, and memory cells are formed at intersections of the pillars and the word lines, respectively. The voltage generating circuit is configured to generate a selection voltage and multiple zone voltages, the selection voltage being applied to a selected word line of the word lines in the memory block during a program operation or a read operation, and the zone voltages being applied to multiple zones, each zone including at least one unselected word line. The address decoder is configured to transfer the selection voltage to the selected word line and the zone voltages to the zones of the unselected word lines, respectively.

The nonvolatile memory device may further include control logic configured to determine the zones and to control application of the selection voltage and the plurality of zone voltages. The address decoder may be further configured to decide whether to apply the selection voltage or one of the zone voltages based on an address and a zone voltage selection signal received from the control logic.

The zone voltages provide optimal program pass voltages or optimal read pass voltages corresponding to the zones during the program or read operations, respectively.

The voltage generating circuit may be further configured to generate an erase voltage, the erase voltage being applied to a substrate of the memory block and other zone voltages being applied to other zones during an erase operation.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
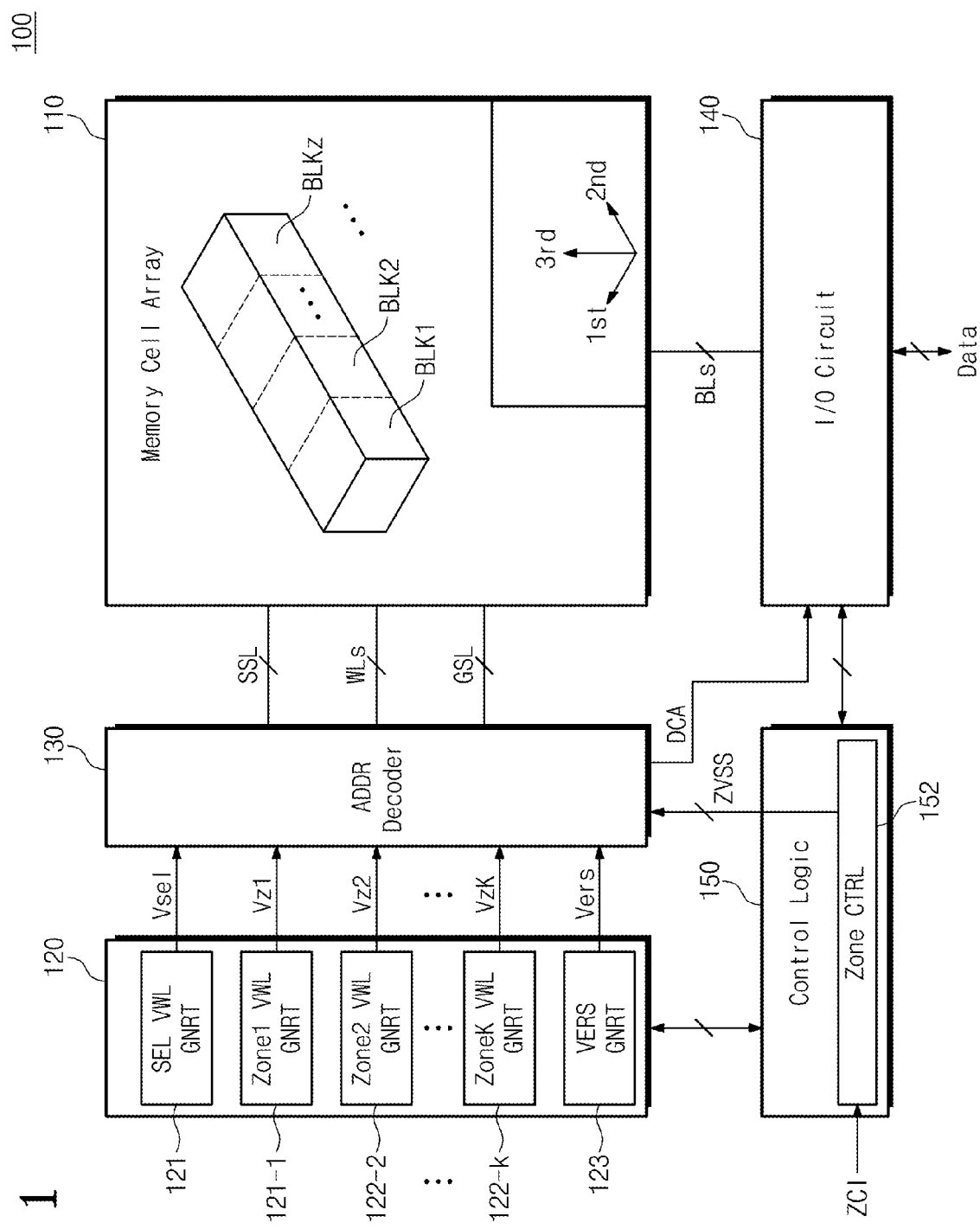
FIG. 1 is a block diagram schematically illustrating a nonvolatile memory device, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "under," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless express+ly so defined herein.

FIG. 1 is a block diagram schematically illustrating a nonvolatile memory device 100, according to an embodiment of the inventive concept. Referring to FIG. 1, a nonvolatile memory device 100 includes a memory cell array 110, a voltage generating circuit 120, an address decoder 130, an input/output circuit 140, and control logic 150.

The memory cell array 110 is connected to the address decoder 130 through word lines, at least one string selection line SSL, and at least one ground selection line GSL. The memory cell array 110 is also connected to the input/output circuit 140. The memory cell array 110 may include multiple memory blocks BLK1 to BLKz.

Each of the memory blocks BLK1 to BLKz may include multiple strings which are arranged along a first direction and a second direction different from the first direction and along a third direction (a direction perpendicular to a plane formed by the first and second directions) to have a three-dimensional structure. Here, each string includes at least one string selection transistor, multiple memory cells, and at least one ground selection transistor stacked on a substrate. Each memory cell may store at least one data bit.

The voltage generating circuit 120 generates a selection voltage Vsel, multiple zone voltages Vz1 to VzK (K being an integer of 2 or more), and an erase voltage Vers. The selection voltage Vsel is applied to a selected word line during a program operation or a read operation, and may be one of a program voltage, a read voltage, and a verification voltage. The zone voltages Vz1 to VzK may be word line voltages respectively corresponding to zones. Here, zones refer to groups of word lines in a selected memory block.

In the depicted embodiment, the voltage generating circuit 120 includes a selection voltage generator 121, zone voltage generators 122-1 to 122-$k$, and an erase voltage generator 123. The selection voltage generator 121 generates the selection voltage Vsel according to a control of the control logic 150.

Although not shown in FIG. 1, the selection voltage generator 121 may include a high voltage generator to generate a high voltage such as a program voltage, a low voltage generator to generate a low voltage such as a read voltage, and a negative voltage generator to generate a negative voltage.

The zone voltage generators 122-1 to 122-k generate the zone voltages Vz1 to VzK, respectively, under control of the control logic 150. During a program/read operation, the zone voltages Vz1 to VzK may generate optimal program pass voltages or optimal read pass voltages respectively corresponding to the different zones. These optimal program pass voltages and optimal program read voltages may be determined, at least in part, by the proximity of the word lines in the different zones to the selected word line and/or to the substrate.

The erase voltage generator 123 generates the erase voltage Vers under control of the control logic 150. The erase voltage Vers may be applied to a substrate of a memory block to be erased in an erase operation. Various zone voltages Vz1 to VzK may also be applied to different zones in the erase operation.

The address decoder 130 is connected to the memory cell array 110 through the word lines, the string selection line SSL and the ground selection line GSL. The address decoder 130 may select the word lines, the string selection line SSL and the ground selection line GSL using a decoded row address. The address decoder 130 may decode a column address of an input address ADDR to provide a decoded column address DCA. The decoded column address DCA may be provided to the input/output circuit 140. In exemplary embodiments, the address decoder 130 may include a row decoder, a column decoder, an address buffer, and so on.

During a program operation or a read operation, the address decoder 130 transfers the selection voltage Vsel to a selected word line and the zone voltages Vz1 to VzK to zones of unselected word lines, respectively. During an erase operation, the address decoder 130 transfers the zone voltages Vz1 to VzK to zones of a selected memory block. The erase voltage Vers is applied to a substrate of the memory block to be erased.

The address decoder 130 may be configured to vary, adjust, change and/or control zones during a program, read or erase operation under control of the control logic 150. For example, the address decoder 130 may be configured to decide whether to apply the selection voltage Vsel or one of the zone voltages Vz1 to VzK to each word line based on an address and a zone voltage selection signal ZVSS. The zone voltage selection signal ZVSS is provided from the control logic 150.

The input/output circuit 140 is connected to the memory cell array 110 through bit lines. The input/output circuit 140 is configured to receive the decoded column address DCA from the address decoder 130. The input/output circuit 140 may select the bit lines using the decoded column address DCA.

The input/output circuit 140 may receive data from an external device (e.g., a memory controller) to store in the memory cell array 110. The input/output circuit 140 may read data from the memory cell array 110 to output to the external device. Also, the input/output circuit 140 may read data from a first area of the memory cell array 110 to store it in a second area of the memory cell array 110. For example, the input/output circuit 140 may be configured to perform a copy-back operation.

The control logic 150 controls overall operation of the nonvolatile memory device 100 including program operations, read operations, erase operations, and so on. The control logic 150 may operate in response to control signals or commands provided from the external device. In the depicted embodiment, the control logic 150 includes a zone controller 152 to vary/change/adjust/control zone configuration according to zone configuration information ZCI. The zone controller 152 generates the zone voltage selection signal ZVSS according to the zone configuration information ZCI.

In exemplary embodiments, the zone configuration information ZCI may be generated in the nonvolatile memory device 100. In other exemplary embodiments, the zone configuration information ZCI may be provided from an external device.

In exemplary embodiments, the zone configuration information ZCI may be variable according to modes of operation of the nonvolatile memory device 100, such as a program mode, a read mode, an erase mode, and so on. Also, in exemplary embodiments, when erase speeds of memory cells corresponding to zones are different, the zone controller 152 may change the zone configuration information ZCI.

Generally, a conventional nonvolatile memory device includes fixed zones performing different word line biasing according to variations in a hole size of a string. In the event that a word line is controlled, disturbance and reliability characteristics may deteriorate or a difference between erase speeds may be generated. In comparison, the nonvolatile memory device 100 according to an embodiment of the inventive concept may control zones according to modes of operation to perform optimal program, read, and erase operations. That is, the nonvolatile memory device 100 may control zones according to modes of operation and/or relative positioning of word lines to minimize side effects according to variations in a hole size.

Figure 2:
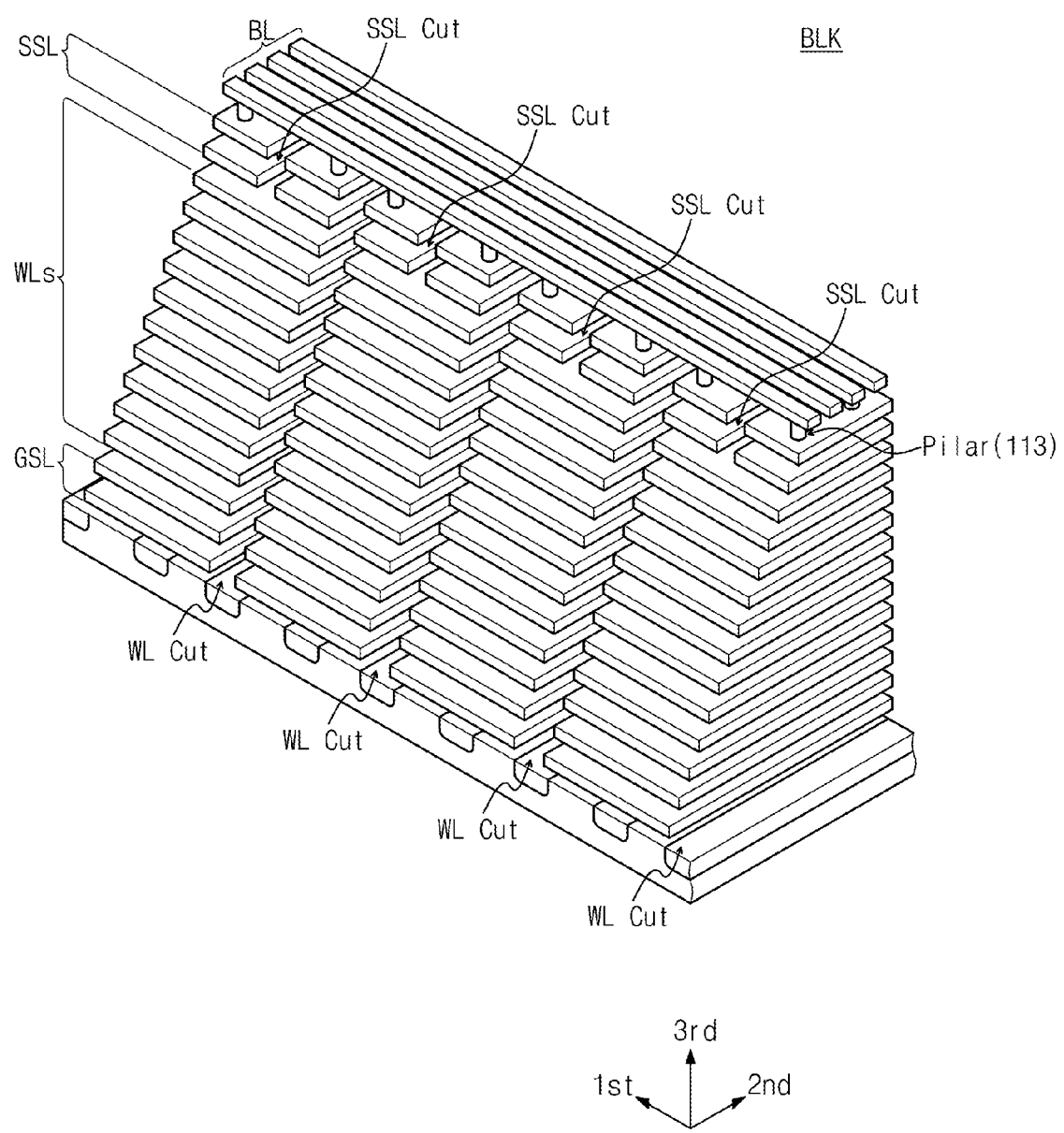
FIG. 2 is a perspective view of a memory block of FIG. 1, according to an embodiment of the inventive concept.

FIG. 2 is a perspective view of an illustrative memory block BLK of FIG. 1, according to an embodiment of the inventive concept. Referring to FIG. 2, four sub blocks are formed on a substrate. Each sub block is formed by stacking at least one plate-shaped ground selection line GSL, multiple plate-shaped word lines, and at least one plate-shaped string selection line SSL on the substrate between word line cuts. The string selection lines SSL may be separated by string selection line cuts, and the word lines WL may be separated by word line cuts. Although not shown in FIG. 2, each word line cut may include a common source line CSL. In exemplary embodiments, the common source lines CSL included in the word line cuts may be interconnected. An illustrative string is formed by a pillar 113 connected with a bit line BL and penetrating the at least one string selection line SSL, the word lines, and the at least one ground selection line GSL.

In FIG. 2, a structure between word line cuts may be a sub block. However, embodiments of the inventive concept are not limited thereto. For example, a structure between a word line cut and a string selection line cut may be a sub block.

The memory block BLK of the inventive concept may be implemented to have a merged word line structure where two word lines are merged to one.

Figure 3:
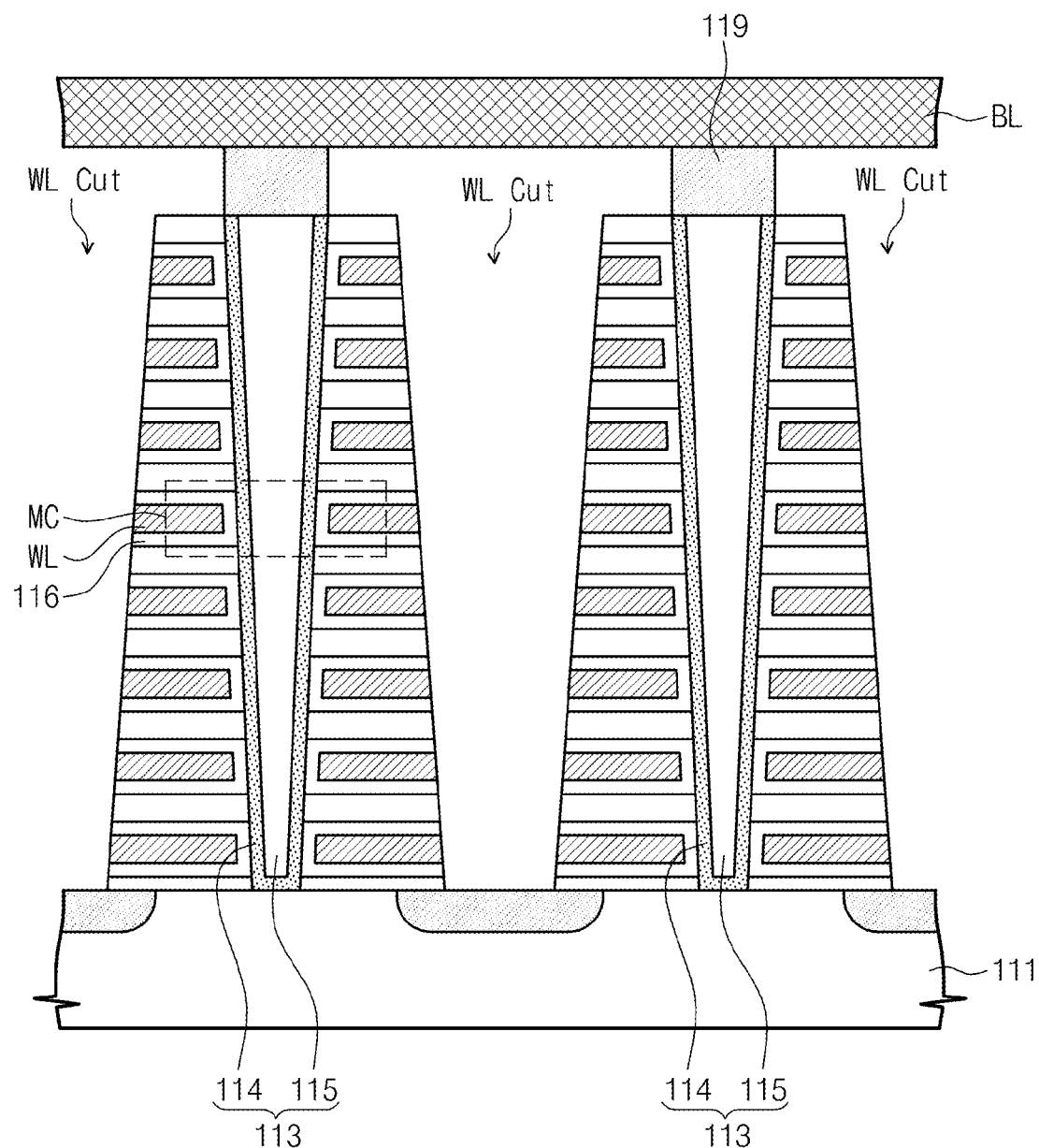
FIG. 3 is a cross-sectional view of a pillar, according to an embodiment of the inventive concept.

FIG. 3 is a cross-sectional view of a pillar according to an embodiment of the inventive concept. Referring to FIG. 3, each pillar 113 includes a channel film 114 and an insulation material 115. The channel film 114 may be formed of a p-type silicon material, for example. The diameter of one end of each pillar 113 adjacent to a bit line may be larger than the diameter of the other end of each pillar 113 adjacent to a substrate 111. That is, each pillar 113 may be tapered toward the substrate 111. As illustrated in FIG. 3, memory cells MC are formed where each pillar 113 penetrates word lines. Each memory cell MC thus includes channel film 114, insulation material 115, and an information storage layer 116.

As illustrated in FIG. 3, because each pillar 113 is tapered toward the substrate 111, electrical characteristics of the memory cells MC vary according to their structural locations. According to embodiments of the inventive concept, zone may be determined according to the structural location (or, the location of a corresponding word line). In the nonvolatile memory device 100, for example, a zone may be adjusted/changed/controlled according to modes of operation to have optimal performance. That is, a zone may not be fixed. Thus, it is possible to configure zones freely based on zone configuration information ZCI.

Figure 4:
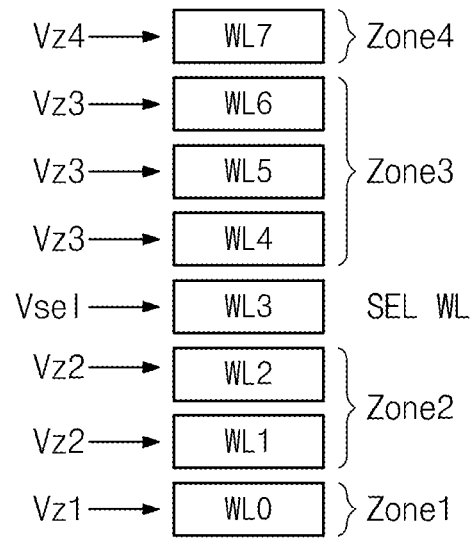
FIG. 4 is a diagram schematically illustrating zone organization during a program operation or a read operation of a nonvolatile memory device of FIG. 1, according to an embodiment of the inventive concept.

FIG. 4 is a diagram schematically illustrating zone organization during a program or read operation of nonvolatile memory device 100 of FIG. 1, according to an embodiment of the inventive concept. For ease of description, it is assumed that the number of word lines is eight (word lines WL0 to WL7) and that word line WL3 is selected during a program or read operation. Referring to FIG. 4, zone controller 152 (refer to FIG. 1) may make four zones Zone1 to Zone4 during a read or program operation.

For example, a first zone Zone1 may be formed of a word line WL0 closest to the substrate 111 (refer to FIG. 3), a second zone Zone2 may consist of two word lines WL1 and WL2, a third zone Zone3 may be formed of three word lines WL4, WL5 and WL6, and a fourth zone Zone4 may be constituted of a word line WL7 furthest from the substrate 111. Zone voltages Vz1 to Vz4 are respectively applied to the first through fourth zones Zone1 to Zone4. Here, the word lines WL0 to WL7 are sequentially stacked on the substrate.

The zone organization during a read/program operation illustrated in FIG. 4 is an example. The zone controller 152 may variously decide the number of zones and the number of word lines in each zone.

In FIG. 4, the zone organization during the program operation may be the same as that during the read operation. However, embodiments of the inventive concept are not limited thereto. For example, the zone organization during the program operation may be different from that during the read operation.

Figure 5:
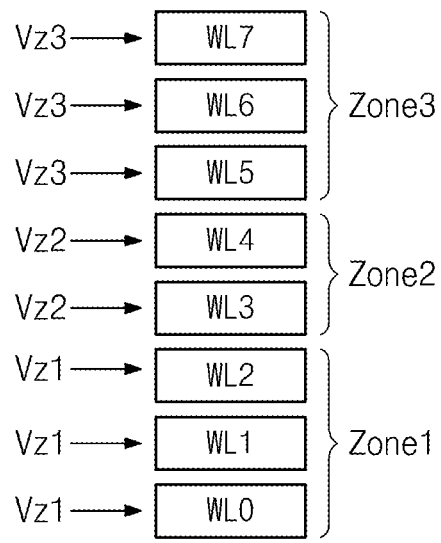
FIG. 5 is a diagram schematically illustrating zone organization during an erase operation of a nonvolatile memory device of FIG. 1, according to an embodiment of the inventive concept.

FIG. 5 is a diagram schematically illustrating zone organization during an erase operation of a nonvolatile memory device 100 of FIG. 1. Again, for ease of description, it is assumed that the number of word lines is eight. Referring to FIG. 5, the zone controller 152 (refer to FIG. 1) may make three zones Zone1 to Zone3 during an erase operation.

For example, a first zone Zone1 closest to the substrate 111 (refer to FIG. 3) may be formed of three word lines WL0 to WL2, a second zone Zone2 may consist of two word lines WL3 and WL4, and a third zone Zone3 may be formed of three word lines WL5, WL6 and WL7. Zone voltages Vz1 to Vz3 are respectively applied to the first through third zones Zone1 to Zone3. Here, the word lines WL0 to WL7 are sequentially stacked on the substrate 111.

The zone organization illustrated in FIG. 5 is an example. The zone controller 152 may variously decide the number of zones and the number of word lines in each zone during the erase operation.

Figure 6:
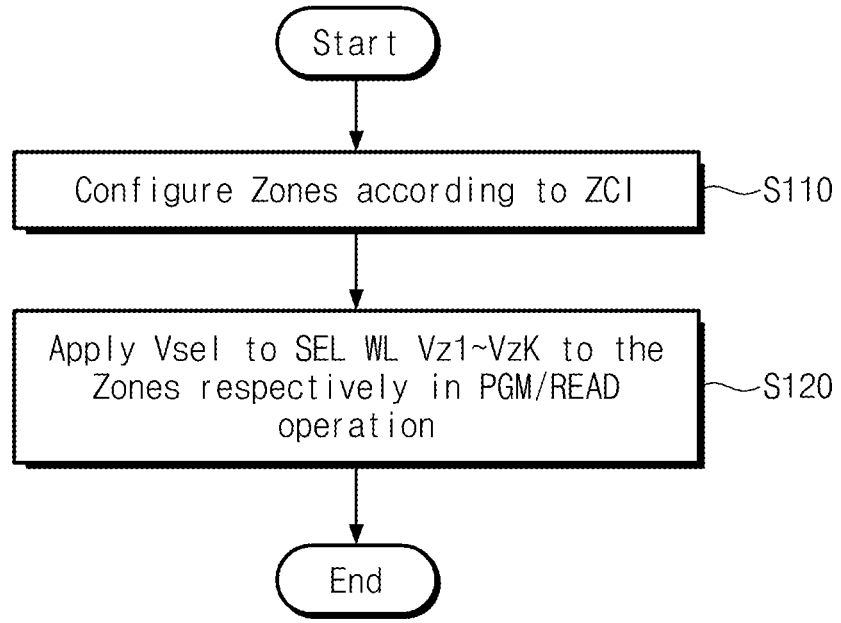
FIG. 6 is a flow chart schematically illustrating a method of driving a nonvolatile memory device, according to an embodiment of the inventive concept.

FIG. 6 is a flow chart schematically illustrating a method of driving a nonvolatile memory device 100, according to an embodiment of the inventive concept. Below, a method of driving the nonvolatile memory device 100 according to an embodiment of the inventive concept will be more fully described with reference to FIGS. 1 to 6.

In operation S110, the zone controller 152 configures zones of unselected word lines based on zone configuration information ZCI during a program or read operation. The zone configuration information ZCI may be provided from an external device or internally generated. For example, the zone configuration information ZCI may be provided from the external device according to management information of a nonvolatile memory device 100, such as block erase information, cell characteristic information, temperature information, power information, noise information, etc. In operation S120, a program or read operation is performed by applying a selection voltage Vs to a selected word line and zone voltages Vz1 to VzK to configured zones.

With the driving method of a nonvolatile memory device of embodiments of the inventive concept, zones may be configured based on the zone configuration information ZCI to perform a program or read operation.

Figure 7:
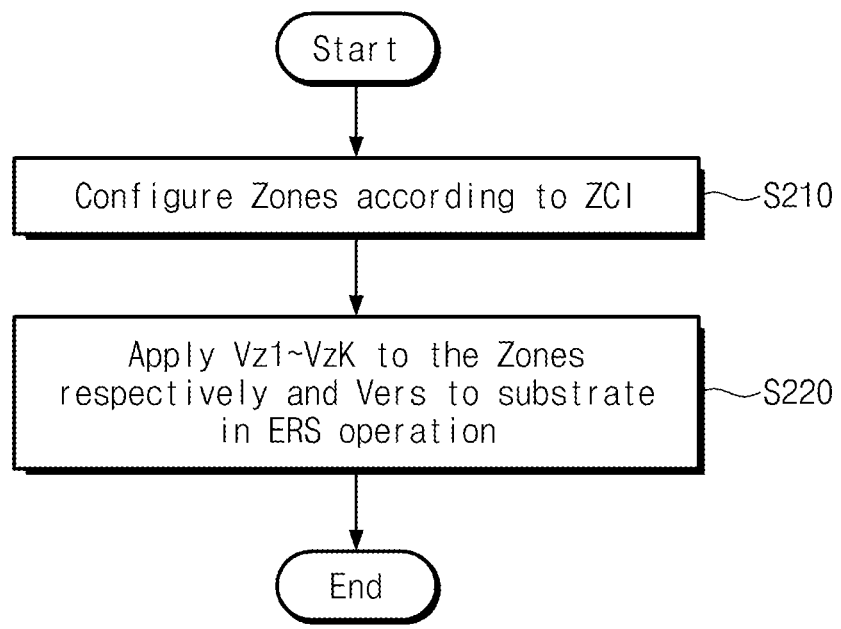
FIG. 7 is a flow chart schematically illustrating a method of erasing a nonvolatile memory device, according to an embodiment of the inventive concept.

FIG. 7 is a flow chart schematically illustrating a method of erasing the nonvolatile memory device 100, according to an embodiment of the inventive concept. Below, a method of erasing the nonvolatile memory device 100 according to an embodiment of the inventive concept will be more fully described with reference to FIGS. 1 to 5 and 7.

In operation S210, the zone controller 152 controls the address decoder 130 to configure zones of word lines based on zone configuration information ZCI. In exemplary embodiments, when zone erase speeds are different, the zone configuration information ZCI may be changed according to a result of checking a location of a state of a specific memory cell. In operation S220, an erase operation is performed by applying an erase voltage Vers to a substrate and zone voltages Vz1 to VzK to configured zones, respective.

With the erase method of a nonvolatile memory device of embodiments of the inventive concept, zones may be configured based on the zone configuration information ZCI to perform an erase operation.

Figure 8:
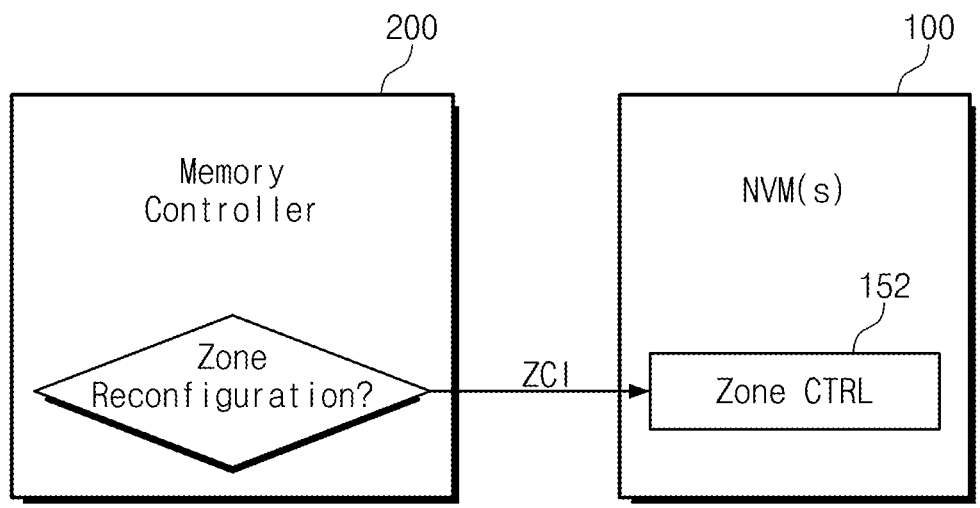
FIG. 8 is a block diagram schematically illustrating a memory system, according to an embodiment of the inventive concept.

FIG. 8 is a block diagram schematically illustrating a memory system 10, according to an embodiment of the inventive concept.

Referring to FIG. 8, a memory system 10 includes a nonvolatile memory device and a memory controller 200 controlling the nonvolatile memory device 100. The memory controller 200 may determine whether to change zone configurations during driving of the nonvolatile memory device 100, and may provide the nonvolatile memory device 100 with new zone configuration information ZCI according to the determination result. The zone controller 152 of the nonvolatile memory device 100 may configure zones based on the new zone configuration information ZCI. Afterwards, an operation requested by the memory controller 200 may be performed.

In exemplary embodiments, the memory controller 200 may determine whether zone configuration information ZCI has changed, based on information indicating a degree of deterioration of a memory block to be driven.

In exemplary embodiments, the memory controller 200 may determine whether zone configuration information ZCI is changed, in consideration of an external circumstance of the memory system 10. Here, the external circumstance of the memory system 10 may include a temperature of the memory system 10, a temperature of the nonvolatile memory device 100, noise, a power state, etc.

The memory system 10 according to an embodiment of the inventive concept may determine whether to change zone configuration information ZCI, and then change the zone configuration information ZCI according to the determination result. Thus, it is possible to drive the nonvolatile memory device 100 optimally.

Embodiments of the inventive concept are applicable to a solid state drive (SSD), for example.

Figure 9:
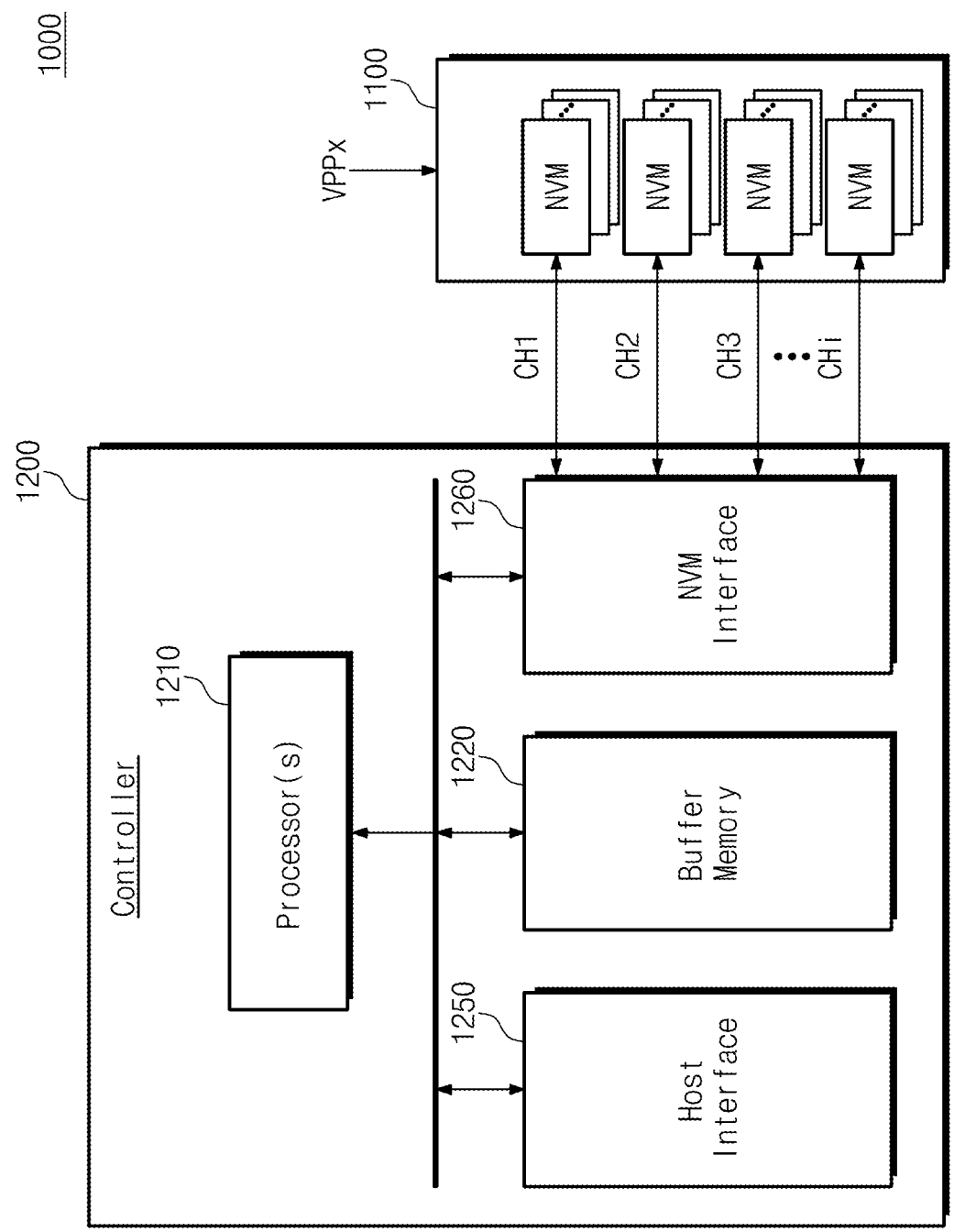
FIG. 9 is a block diagram schematically illustrating a solid state drive, according to an embodiment of the inventive concept.

FIG. 9 is a block diagram schematically illustrating a solid state drive, according to an embodiment of the inventive concept. Referring to FIG. 9, a solid state drive (SSD) 1000 includes multiple flash memory devices 1100 and an SSD controller 1200. The flash memory devices 1100 are supplied with an external high voltage VPPx. Each of the flash memory devices 1100 may be implemented to configure zone organization differently according to modes of operation described above with reference to FIGS. 1 to 7. The SSD controller 1200 may be connected to the flash memory devices 1100 through multiple channels CH1 to CHi (i being an integer of 2 or more). In the depicted embodiment, the SSD controller 1200 includes at least one processor 1210, a buffer memory 1220, a host interface 1250, and an NVM interface 1260 (e.g., flash interface).

The SSD 1000 according to an embodiment of the inventive concept may satisfy an optimal driving condition by configuring zone organization differently according to modes of operation.

Embodiments of the inventive concept are applicable to an embedded MMC (hereinafter, referred to as eMMC).

Figure 10:
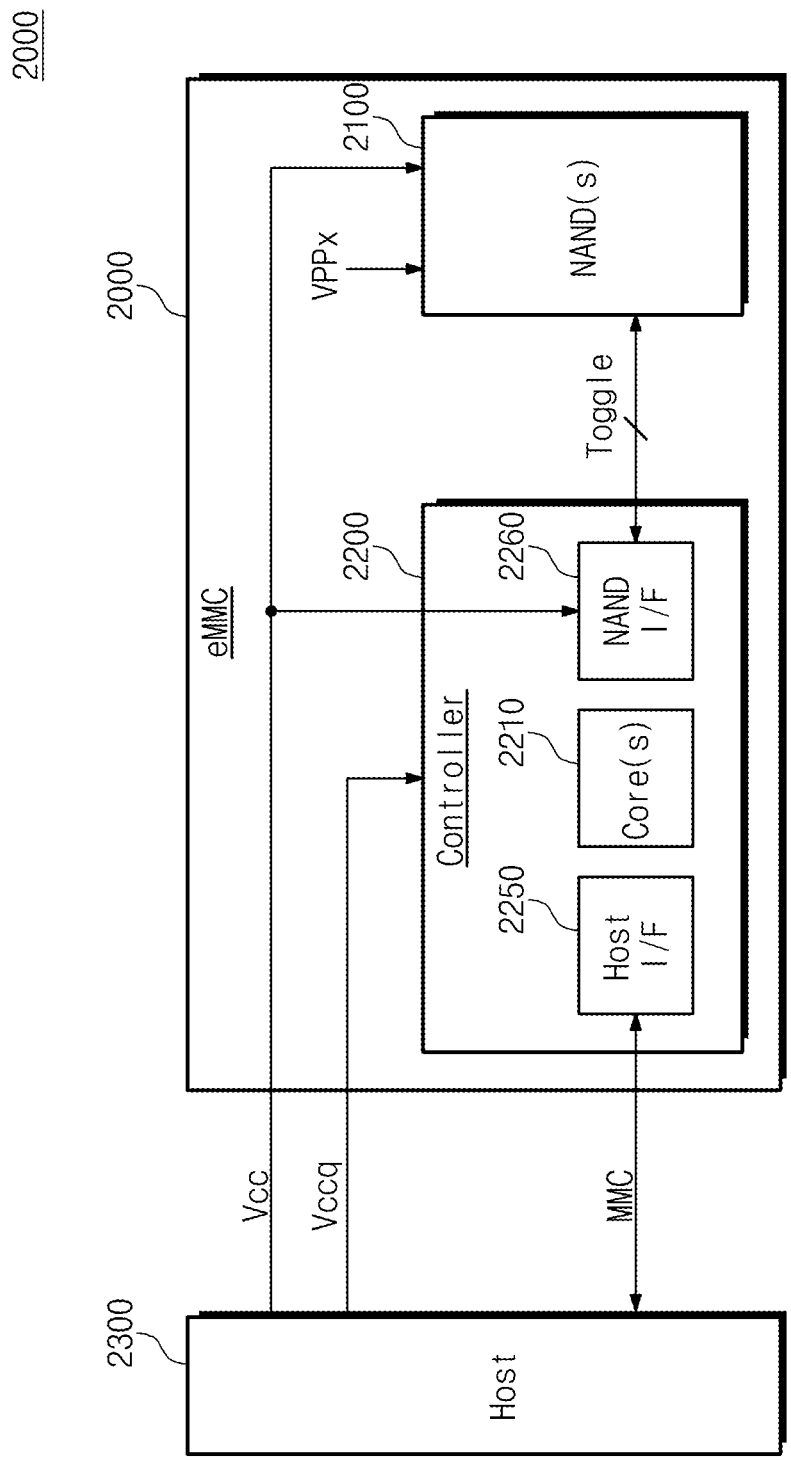
FIG. 10 is a block diagram schematically illustrating an eMMC, according to an embodiment of the inventive concept.

FIG. 10 is a block diagram schematically illustrating an eMMC according to an embodiment of the inventive concept. Referring to FIG. 10, an eMMC 2000 includes at least one NAND flash memory device 2100 and controller 2200 integrated in a chip. The NAND flash memory device 2100 may be a single data rate (SDR) NAND flash memory device or a double data rate (DDR) NAND flash memory device, for example. In exemplary embodiments, the NAND flash memory device 2100 may include NAND flash memory chips. Herein, the NAND flash memory device 2100 may be implemented by stacking the NAND flash memory chips in one package (e.g., Fine-pitch Ball Grid Array (FBGA), etc.). Each of the NAND flash memory devices may be implemented to configure zone organization differently according to modes of operation described with reference to FIGS. 1 to 7.

The controller 2200 may be connected with the NAND flash memory device 2100 via multiple channels. In the depicted embodiment, the controller 2200 includes at least one controller core 2210, a host interface 2250, and a NAND interface 2260. The controller core 2210 controls overall operation of the eMMC 2000. The host interface 2250 is configured to interface between the controller 2210 and a host 2300. The NAND interface 2260 is configured to provide an interface between the NAND flash memory device 2100 and the controller 2200. In exemplary embodiments, the host interface 2250 may be a parallel interface (e.g., an MMC interface). In other exemplary embodiments, the host interface 2250 of the eMMC 2000 may be a serial interface (e.g., UHS-II, UFS, etc.).

The eMMC 2000 receives power supply voltages Vcc and Vccq from the host 2300. Herein, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200.

The eMMC 2000 according to an embodiment of the inventive concept is applicable to small-sized and low-power mobile products (e.g., Galaxy S® series, Galaxy Note® series, iPhone®, iPad®, Nexus, etc.).

Embodiments of the inventive concept are applicable to universal flash storage (UFS).

Figure 11:
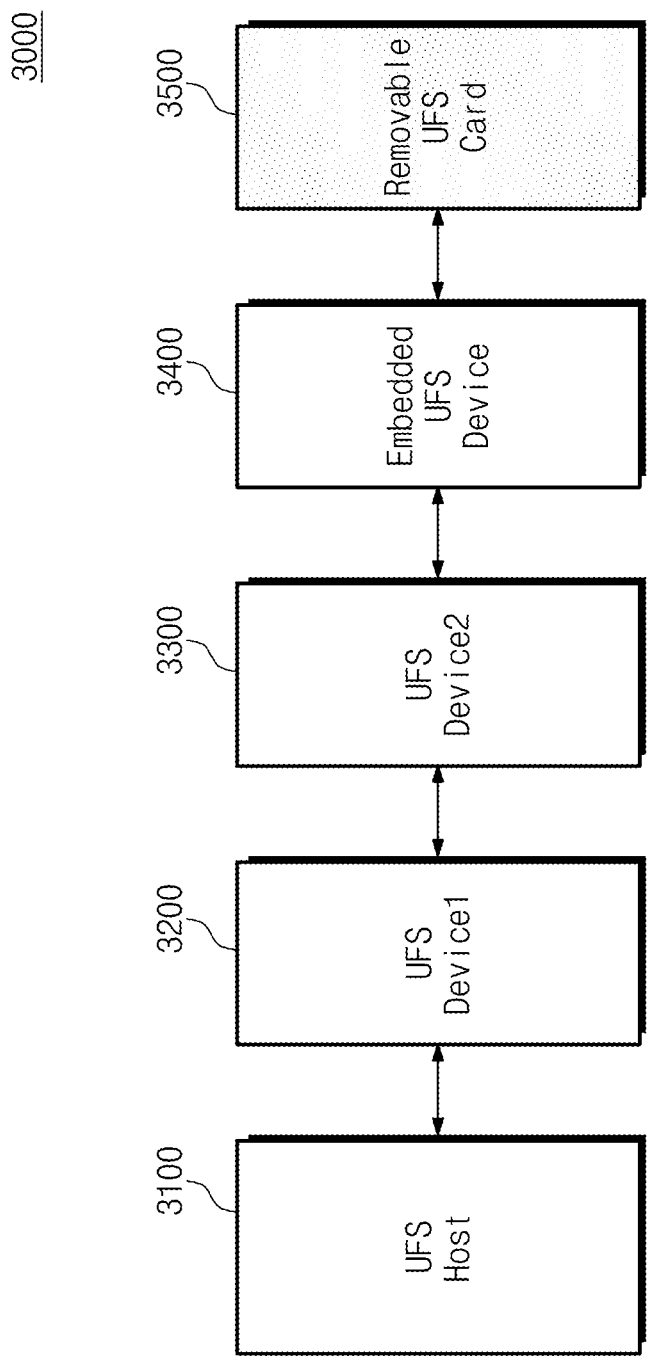
FIG. 11 is a block diagram schematically illustrating a UFS system, according to an embodiment of the inventive concept.

FIG. 11 is a block diagram schematically illustrating a UFS system 3000, according to an embodiment of the inventive concept. Referring to FIG. 11, a UFS system 3000 includes a UFS host 3100, UFS devices 3200 and 3300, an embedded UFS device 3400, and a removable UFS card 3500. The UFS host 3100 may be an application processor of a mobile device, for example. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may include a nonvolatile memory device 100 of FIG. 1.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, secure digital (SD), mini SD, Micro SD, etc.).

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of driving a nonvolatile memory device, comprising a plurality of strings, each string formed by penetrating plate-shaped word lines stacked on a substrate, the method comprising:
configuring the word lines of a string in a plurality of zones based on zone configuration information, wherein each of the zones as configured by the zone configuration information includes at least one word line, and at least two word lines are grouped in a same zone among the plurality of zones; and
applying respective zone voltages to the zones such that the word lines of each zone receive a same respective zone voltage,
wherein the zone configuration information is varied between at least a first mode of operation and a second mode of operation, wherein a grouping of at least two word lines in the same zone of the first mode of operation is different than a grouping of at least two word lines in the same zone of the second mode of operation.

2. The method of claim 1, wherein the zone configuration information is generated in the nonvolatile memory device.

3. The method of claim 1, wherein the zone configuration information is provided from an external device.

4. The method of claim 3, further comprising:
determining whether the zone configuration is required.

5. The method of claim 1, wherein the first mode of operation comprises one of a program mode, a read mode or an erase mode, and the second mode of operation comprises a different one of the program mode, the read mode or the erase mode.

6. The method of claim 5, wherein the zone configuration information during the program mode is the same as the zone configuration information during the read mode, and wherein the zone configuration information during the read and program modes is different from the zone configuration information during the erase mode.

7. The method of claim 1, further comprising:
applying a selection voltage to a selected word line during a read operation or a program operation,
wherein unselected word lines are configured into the plurality of zones, and applying zone voltages to the zones comprises applying the zone voltages to the configured zones of the unselected word lines.

8. The method of claim 7, further comprising:
generating the selection voltage; and
generating the zone voltages.

9. The method of claim 1, further comprising:
applying an erase voltage to the substrate during an erase operation, while applying the zone voltages to the configured zones.

10. The method of claim 9, further comprising:
changing the zone configuration information when erase speeds of memory cells corresponding to the zones are different.

11. The driving method of claim 1, wherein configuring the word lines to a plurality of zones based on zone configuration information comprises:
selecting one of the word lines to which one of the zone voltages is to be applied, based on the zone configuration information.

12. The method of claim 1, further comprising:
applying an erase voltage to the substrate during an erase operation, while applying the zone voltages to the configured zones; and
changing the zone configuration information when erase speeds of memory cells corresponding to the zones are different.

13. A memory system, comprising:
a nonvolatile memory device comprising a plurality of memory blocks, each memory block having a plurality of strings formed by penetrating plate-shaped word lines stacked on a substrate; and
a memory controller configured to control the nonvolatile memory device,
wherein the nonvolatile memory device further comprises:
a zone controller configured to control configuration of the word lines to a plurality of zones based on zone configuration information,
wherein each of the zones as configured by the zone configuration information includes at least one word line, and at least two word lines are grouped in a same zone among the plurality of zones; and
a plurality of zone voltage generators configured to generate respective zone voltages corresponding to the zones such that the word lines of each zone receive a same respective zone voltage,
wherein the zone configuration information is varied between at least a first mode of operation and a second mode of operation of the nonvolatile memory device, wherein a grouping of at least two word lines in the same zone of the first mode of operation is different than a grouping of at least two word lines in the second mode of operation.

14. The memory system of claim 13, wherein the nonvolatile memory device further comprises:
an address decoder configured to select one of the memory blocks based on an input address and to provide the zone voltages to corresponding zones based on the zone configuration information for the selected memory block.

15. The memory system of claim 13, wherein the nonvolatile memory device further comprises:
a selection voltage generator configured to generate a selection voltage to be applied to a selected one of the word lines during a program operation or a read operation.

16. The memory system of claim 13, wherein the memory controller is configured to determine whether a change of the zone configuration information is required, and to send new zone configuration information to the nonvolatile memory device based on the determination result.

17. A method of driving a nonvolatile memory device, comprising a plurality of strings, each string formed by penetrating plate-shaped word lines stacked on a substrate, the method comprising:
configuring the word lines of a string in a plurality of zones based on zone configuration information; and
applying zone voltages to the zones, respectively,
wherein the zone configuration information is varied according to a mode of operation,
wherein the mode of operation comprises one of a program mode, a read mode or an erase mode, and
wherein the zone configuration information during the program mode is the same as the zone configuration information during the read mode, and wherein the zone configuration information during the read and program modes is different from the zone configuration information during the erase mode.

18. The method of claim 17, wherein the zone configuration information is generated in the nonvolatile memory device.

19. The method of claim 17, wherein the zone configuration information is provided from an external device.

20. The method of claim 19, further comprising:
determining whether the zone configuration is required.

* * * * *